(12) United States Patent
Ifuku et al.

(10) Patent No.: US 12,014,907 B2
(45) Date of Patent: Jun. 18, 2024

(54) METHOD AND DEVICE FOR FORMING GRAPHENE STRUCTURE

(71) Applicant: Tokyo Electron Limited, Tokyo (JP)

(72) Inventors: Ryota Ifuku, Nirasaki (JP); Takashi Matsumoto, Nirasaki (JP); Masahito Sugiura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 296 days.

(21) Appl. No.: 17/593,220

(22) PCT Filed: Feb. 26, 2020

(86) PCT No.: PCT/JP2020/007748
§ 371 (c)(1),
(2) Date: Sep. 13, 2021

(87) PCT Pub. No.: WO2020/189202
PCT Pub. Date: Sep. 24, 2020

(65) Prior Publication Data
US 2022/0223407 A1   Jul. 14, 2022

(30) Foreign Application Priority Data
Mar. 15, 2019  (JP) .................................. 2019-049093

(51) Int. Cl.
*H01L 21/31* (2006.01)
*C23C 16/02* (2006.01)
(Continued)

(52) U.S. Cl.
CPC .... *H01J 37/32724* (2013.01); *C23C 16/0218* (2013.01); *C23C 16/26* (2013.01); *C23C 16/511* (2013.01); *H01J 37/3222* (2013.01); *H01J 37/32357* (2013.01); *H01L 21/02115* (2013.01); *H01L 21/02274* (2013.01); *H01L 21/02527* (2013.01); *H01L 21/0262* (2013.01); *H01L 21/28556* (2013.01); *H01J 2237/3321* (2013.01); *H01L 21/02444* (2013.01); *H01L 21/02658* (2013.01)

(58) Field of Classification Search
CPC ......... H01L 21/02115; H01L 21/02274; H01L 21/02527; C23C 26/0218; C23C 26/511
USPC ........................................................ 438/758
See application file for complete search history.

(56) References Cited

U.S. PATENT DOCUMENTS

| | | | |
|---|---|---|---|
| 10,850,985 B2 * | 12/2020 | Jung | ...................... C23C 16/511 |
| 2010/0006812 A1 * | 1/2010 | Xu | ........................ B82Y 30/00 |
| | | | 977/773 |

(Continued)

FOREIGN PATENT DOCUMENTS

| | | | |
|---|---|---|---|
| JP | 2013-100205 A | 5/2013 | |
| JP | 2014-231455 A | 12/2014 | |

(Continued)

*Primary Examiner* — Nitin Parekh
(74) *Attorney, Agent, or Firm* — Armstrong Teasdale LLP

(57) ABSTRACT

A method of forming a graphene structure, includes: providing a substrate; performing a preprocessing by supplying a first processing gas including a carbon-containing gas to the substrate while heating the substrate, without using plasma; and after the preprocessing, forming the graphene structure on a surface of the substrate through a plasma CVD using plasma of a second processing gas including a carbon-containing gas.

13 Claims, 12 Drawing Sheets

(51) Int. Cl.
*C23C 16/26* (2006.01)
*C23C 16/511* (2006.01)
*H01J 37/32* (2006.01)
*H01L 21/02* (2006.01)
*H01L 21/285* (2006.01)

(56) References Cited

U.S. PATENT DOCUMENTS

| | | | | |
|---|---|---|---|---|
| 2010/0320437 | A1* | 12/2010 | Gordon | B82Y 40/00 438/758 |
| 2012/0196074 | A1* | 8/2012 | Ago | B82Y 40/00 977/734 |
| 2016/0130150 | A1* | 5/2016 | Park | H01L 21/0262 156/247 |
| 2016/0215309 | A1* | 7/2016 | Sun | C12P 7/6409 |
| 2017/0210629 | A1* | 7/2017 | Cho | C01B 32/186 |

FOREIGN PATENT DOCUMENTS

| | | |
|---|---|---|
| JP | 2016-520032 A | 7/2016 |
| JP | 2017-521339 A | 8/2017 |

\* cited by examiner

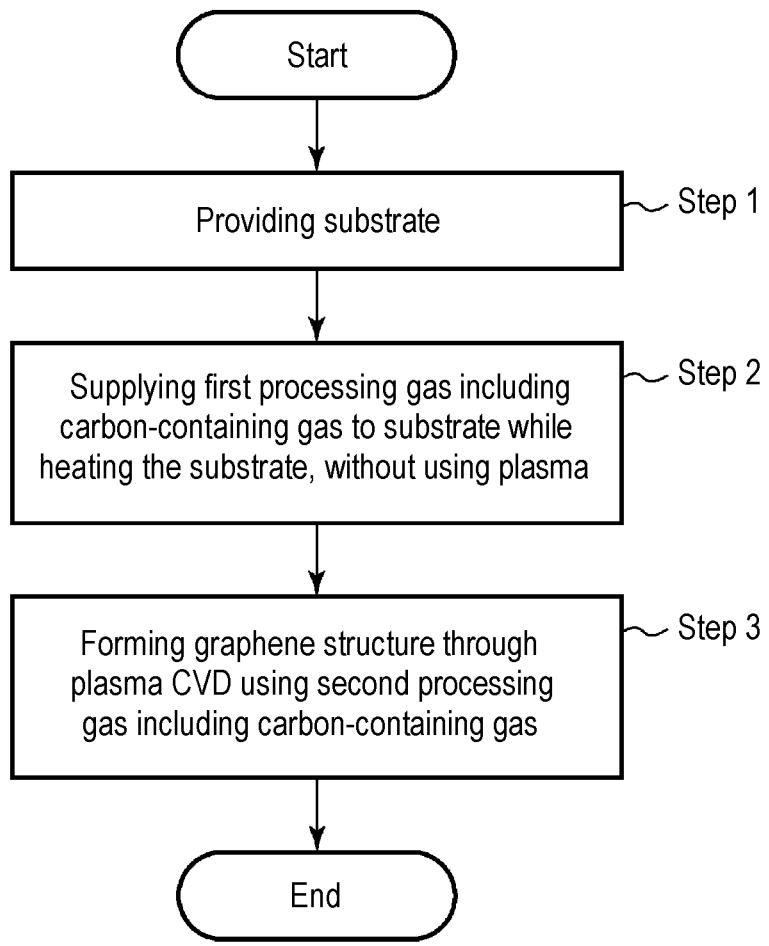

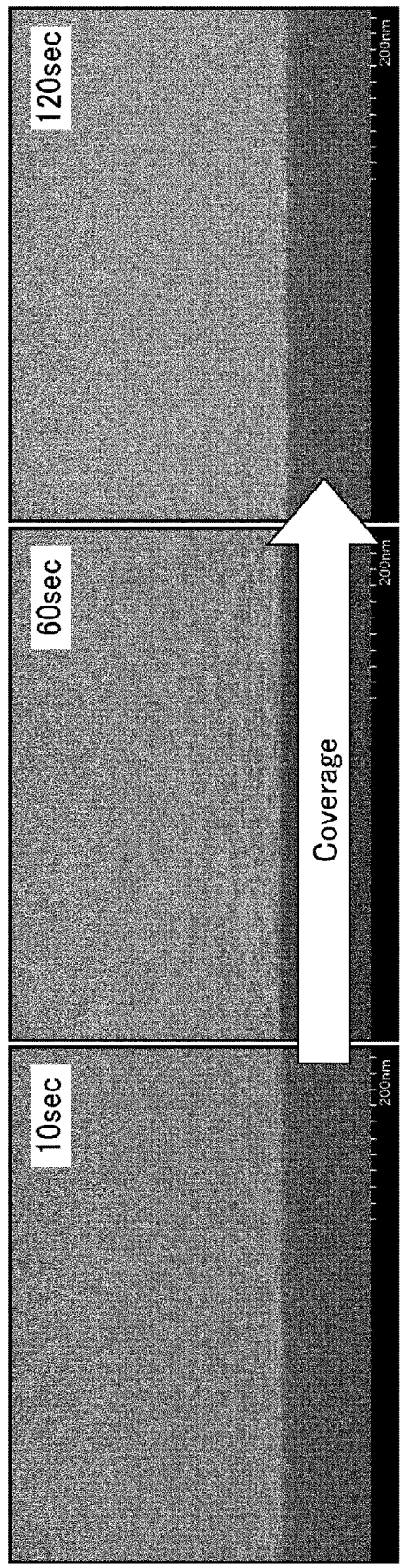

METHOD AND DEVICE FOR FORMING GRAPHENE STRUCTURE

TECHNICAL FIELD

The present disclosure relates to a method of forming a graphene structure and an apparatus therefor.

BACKGROUND

Graphene is a thin film of graphite having one to several tens or hundreds of atomic layers formed on a substrate. As a graphene structure, a carbon nanowall (hereinafter, also referred to as "CNW") in which several layers of graphene sheets are grown at an angle, typically, a right angle with respect to a substrate, is known in addition to ordinary graphene formed parallel to a substrate.

Graphene is configured as an aggregate of six-membered ring structures by covalent bonds ($sp^2$-bonds) of carbon atoms, and exhibits unique electronic properties, such as a mobility of 200,000 $cm^2$/Vs or more, which is 100 times or more than that of silicon (Si), and a current density of $10^9$ $A/cm^2$, which is 1,000 times or more than that of Cu.

Due to these characteristics, graphene has attracted attention as a material for various devices, such as wiring, a field effect transistor (FET) channel, and a barrier film, and, due to the structural characteristics thereof, CNWs have attracted attention as a material for various devices, such as a fuel cell, a field electron emission source, a field electron emission source, and a sensor.

As a method for forming graphene, a method in which a catalyst metal layer is formed on a workpiece, the catalyst metal layer is activated, and graphene is then formed through CVD has been proposed. In embodiments of Patent Documents 1 and 2, CVD using microwave plasma is disclosed as an example of CVD.

PRIOR ART DOCUMENTS

Patent Documents

Patent Document 1: Japanese Laid-Open Patent Publication No. 2013-100205
Patent Document 2: Japanese Laid-Open Patent Publication No. 2014-231455

SUMMARY

The present disclosure provides a graphene structure forming method capable of forming a graphene structure having high coverage, and an apparatus therefor.

A method according to an aspect of the present disclosure relates to a method of forming a graphene structure and includes: providing a substrate; performing preprocessing by supplying a first processing gas including a carbon-containing gas to the substrate while heating the substrate, without using plasma; and after the preprocessing, forming a graphene structure on a surface of the substrate through a plasma CVD using plasma of a second processing gas including a carbon-containing gas.

According to the present disclosure, it is possible to form a graphene structure having high coverage.

BRIEF DESCRIPTION OF DRAWINGS

FIG. 1 is a flowchart illustrating a graphene structure forming method according to an embodiment of the present disclosure.

FIG. 15 illustrates SEM photographs showing respective surfaces when the preprocessing times were 10 sec, 60 sec, and 120 sec in Experimental Example 2.

DETAILED DESCRIPTION

Figure 2A:
FIG. 2A is a cross-sectional view illustrating a specific example of a structure of a substrate used in the graphene structure forming method according to the embodiment of the present disclosure.

Hereinafter, embodiments will be described in detail with reference to the accompanying drawings.

<Embodiment of Graphene Structure Forming Method>

First, an embodiment of a graphene structure forming method will be described.

In Patent Documents 1 and 2 described above, in order to efficiently grow graphene having good crystallinity at a temperature as low as possible, a catalyst metal film serving as a catalyst for promoting the growth of graphene, such as Ni, is formed as a base, the catalyst metal layer is activated by plasma of a $H_2$ gas, which is a reducing gas, and a $N_2$ gas, which is a nitrogen-containing gas, and then graphene is grown through plasma CVD (PE-CVD).

However, Patent Documents 1 and 2 do not describe forming graphene on the entire surface of a substrate with high coverage.

In general CVD, film formation proceeds through nucleation and creeping growth. In this case, an example of a method of controlling nucleation density to improve coverage includes surface activation through plasma preprocessing or the like.

However, when trying to sufficiently activate the surface through plasma preprocessing, strong ion damage or charge-up damage to the base may be caused at the same time.

Therefore, as a result of the examination performed by the inventors, it has been found that it is effective to perform, prior to the formation of a graphene structure through plasma CVD, preprocessing of supplying a gas including a carbon-containing gas to the substrate while heating the substrate, without using plasma.

That is, it has been found that, even if the formation of a graphene film is not based on surface activation through general plasma preprocessing, nucleation is possible by supplying a gas including a carbon-containing gas to the substrate while heating the substrate without using plasma. This makes it possible to form a graphene structure having high coverage by promoting nucleation and creeping growth in a subsequent plasma CVD.

In an embodiment, unlike the technique utilizing the catalytic reaction using an activated metal catalyst in Patent Documents 1 and 2 described above, it is possible to cause the film formation reaction of a graphene structure to proceed according to a general crystal growth mode. Therefore, there is an advantage in that complicated steps, such as formation and activation processing of a catalyst metal layer, can be omitted.

The method of manufacturing a graphene structure of an embodiment includes step 1 and step 2, and step 3, as illustrated in FIG. 1. Step 1 is a step of providing a substrate. Step 2 is a step of performing preprocessing by supplying a first processing gas including a carbon-containing gas to the substrate while heating the substrate, without using plasma. Step 3 is a step of forming the graphene structure on a surface of the substrate, which has undergone step 2, through plasma CVD using a second processing gas including a carbon-containing gas.

The substrate in step 1 is not particularly limited as long as film formation using plasma CVD can be performed thereon, but a substrate having a surface, on which film formation of a graphene structure is capable of proceeding by nucleation and creeping growth, is preferable as in general CVD. From this point of view, the substrate preferably has a surface that does not have a catalytic function during plasma CVD. Specifically, as the substrate, a semiconductor or an insulator is suitable. In addition, as the substrate, a metal of which the surface does not have a catalytic function during the plasma CVD step may be used.

Figure 2B:
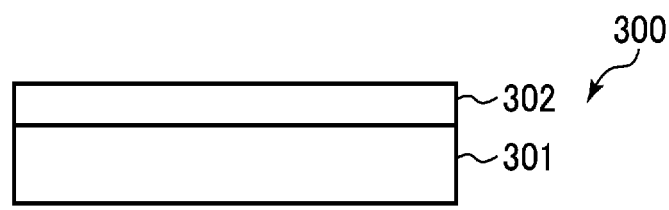
FIG. 2B is a cross-sectional view illustrating another specific example of a structure of a substrate used in the graphene structure forming method according to the embodiment of the present disclosure.
Figure 2C:
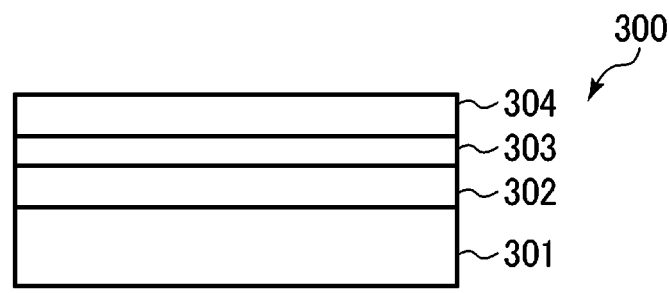
FIG. 2C is a cross-sectional view illustrating still another specific example of the structure of the substrate used in the method for forming the graphene structure according to the embodiment of the present disclosure.

FIGS. 2A to 2C illustrate specific examples of the substrate. An example of the substrate 300 typically includes a semiconductor wafer. Examples of the substrate 300 include those illustrated in FIGS. 2A, 2B, and 2C. In the example of FIG. 2A, the substrate 300 includes only a semiconductor substrate 301 formed of a semiconductor such as silicon. In the example of FIG. 2B, in the substrate 300, an insulating film 302, such as a $SiO_2$ film, is formed on the semiconductor substrate 301, such as silicon. In the example of FIG. 2C, in the substrate 300, a metal film 304, such as a Cu film, is formed on the semiconductor substrate 301 of, for example, silicon, with the insulating film 302, such as a $SiO_2$ film, and a barrier film 303, such as a TaN film, a Ta film, or a TiN film, interposed therebetween. The barrier film 303 may be omitted depending on the metal. In addition, the barrier film 303 may be a laminated film (e.g., Ta/TaN).

Figure 3:
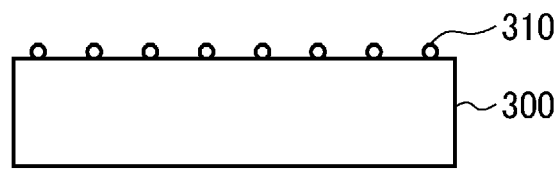
FIG. 3 is a cross-sectional view illustrating a state after step 2 of the graphene structure forming method according to the embodiment of the present disclosure.

In step 2, the substrate 300 is accommodated in the processing container, and a first processing gas including a carbon-containing gas is supplied to the substrate 300 while heating the substrate 300 to a predetermined temperature. As a result, as illustrated in FIG. 3, nuclei 310 for forming a graphene structure are formed on the surface of the substrate 300.

The first processing gas used in step 2 may be a carbon-containing gas alone or may include a hydrogen gas ($H_2$ gas) in addition to the carbon-containing gas. In addition, the first processing gas may include a noble gas as a diluting gas or a carrier gas. As the noble gas, Ar, He, Ne, Kr, Xe, or the like may be used.

As the carbon-containing gas included in the first processing gas, a highly reactive gas is preferable, and a hydrocarbon gas is suitable. Among the hydrocarbon gases, those having an unsaturated bond or those having a small number of carbon atoms are more reactive and thus preferable. For example, acetylene ($C_2H_2$) having a triple bond with 2 carbon atoms, ethylene ($C_2H_4$) having a double bond, or propylene ($C_3H_6$) having a double bond with 3 carbon atoms may be suitably used. Hydrocarbons that do not have an unsaturated bond, such as methane ($CH_4$), ethane ($C_2H_6$), and propane ($C_3H_8$), may be used.

A $H_2$ gas may be added in order to control nucleation. In the formation of graphene through plasma CVD, the formation of graphene proceeds with nucleation and creeping growth based on the following chemical equilibrium equation.

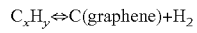

$$C_xH_y \Leftrightarrow C(graphene) + H_2$$

Therefore, it is possible to control the nucleation of graphene by adding the $H_2$ gas.

The amount of the added $H_2$ gas is preferably 300% or less at a volume ratio with respect to the carbon-containing gas from the viewpoint of promoting nucleation.

The temperature of the substrate when performing step 2 is preferably 300 to 1,000 degrees C. More preferably, the temperature is 350 to 750 degrees C. The internal pressure of the processing container is preferably in the range of 1.33 to 1,330 Pa (0.01 to 10 Torr), and more preferably 1.33 to 133 Pa (0.01 to 1 Torr). The processing time is preferably 30 sec or more, more preferably 1 to 10 min.

By performing the preprocessing in step 2 in this way, nuclei for forming the graphene structure are formed, and the nucleation density is controlled. This makes it possible to improve the coverage of the graphene structure through the plasma CVD of step 3 to be subsequently performed.

Figure 4:
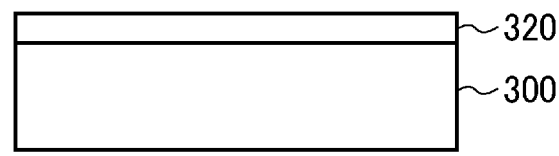
FIG. 4 is a cross-sectional view illustrating a state in which a graphene structure is formed on the substrate by the graphene structure forming method according to the embodiment of the present disclosure.

In the next step 3, the graphene structure 320 is grown on the substrate 300 as illustrated in FIG. 4 by causing the plasma of the second processing gas including the carbon-containing gas to act on the substrate 300 on which the nuclei 310 are formed.

The plasma at this time is not particularly limited, and microwave plasma, particularly remote microwave plasma, is preferably used. In the present disclosure, the remote microwave plasma is a plasma that is generated by a microwave electric field generated by introducing microwaves into the processing container, is diffused from a plasma generation region, and acts on the substrate 300 disposed at a position spaced apart from the plasma generation region. By using the remote microwave plasma, it is possible to dissociate the carbon-containing gas into a state suitable for growing the graphene structure at a relatively low temperature.

In this case, a noble gas may be used as the second processing gas in addition to the carbon-containing gas, which may be used as a film-forming raw material. The noble gas may be used as a plasma generation gas. That is, the microwave plasma is generated by introducing microwaves into the processing container, and introducing the plasma generation gas composed of the noble gas into the processing container. Then, the carbon-containing gas as the film-forming raw material gas is dissociated by the plasma and is supplied to the substrate 300 spaced apart from the plasma generation region. Thus, the graphene structure 320 is grown on the substrate 300.

As the noble gas included in the second processing gas, Ar, He, Ne, Kr, Xe, or the like may be used, but among these, Ar, which is capable of stably generating plasma is preferable.

As the carbon-containing gas included in the second processing gas, for example, a hydrocarbon gas, such as ethylene ($C_2H_4$), methane ($CH_4$), ethane ($C_2H_6$), propane ($C_3H_8$), propylene ($C_3H_6$), or acetylene ($C_2H_2$), or an alcohol gas, such as methanol ($CH_3OH$) or ethanol ($C_2H_5OH$), may be used. The carbon-containing gas used here may be the same as or different from the carbon-containing gas used in step 2.

The second processing gas may also include a hydrogen-containing gas, such as a $H_2$ gas. The quality of the graphene structure may be improved by the hydrogen-containing gas. In addition, an oxidizing gas, such as an oxygen gas ($O_2$ gas) or water vapor ($H_2O$ gas), may be included. The oxidizing gas may etch defects contained in the graphene structure to enhance crystallinity.

In the case of using the remote microwave plasma, the film-forming raw material gas may be introduced at an arbitrary position between the plasma generation region and a region near the substrate, depending on a required degree of dissociation. That is, in the plasma generation region, the degree of dissociation increases due to high-energy plasma, and in the region near the substrate, the degree of dissociation becomes lower than that in the plasma generation region due to the plasma diffused from the plasma generation region and having a low electron temperature. Therefore, the degree of dissociation of the film-forming raw material gas may be adjusted depending on the position at which the film-forming raw material gas is introduced.

In the case of using the remote microwave plasma CVD, the substrate is disposed in a region spaced apart from the microwave plasma generation region, and the plasma diffused from the plasma generation region is supplied to the substrate. For this reason, on the substrate, the plasma has a low electron temperature and thus causes little damage to the substrate, and is turned into high-density plasma mainly composed of radicals by microwaves.

The graphene structure may be simply ordinary graphene formed parallel to the substrate, or may include a carbon nanowall (CNW) grown at an angle with respect to the substrate, in addition to graphene.

As the process conditions when using the remote microwave plasma, the temperature of the substrate is preferably 350 to 1,000 degrees C. (more preferably 400 to 800 degrees C.), and the microwave power is preferably 100 to 5,000 W. When the surface of the substrate is an insulator or a semiconductor, the internal pressure of the processing container is preferably 1.33 to 667 Pa (0.01 to 5 Torr), and when the surface of the substrate is a metal, the internal pressure of the processing container is preferably 1.33 to 400 Pa (0.01 to 3 Torr). The time preferably ranges from 1 to 200 min.

According to the present embodiment, it is possible to form graphene nuclei on a substrate by supplying, prior to forming a graphene structure film through plasma CVD, a gas including a carbon-containing gas to the substrate while heating the substrate, without using plasma. This makes it possible to form a graphene structure having high coverage by promoting nucleation and creeping growth in the subsequent plasma CVD. Therefore, it is not necessary to use an activated metal catalyst layer.

As described above, since the graphene structure is formed according to the general crystal growth mode of nucleation and creeping growth, it is not necessary to utilize the catalytic reaction by an activated metal catalyst as in Patent Documents 1 and 2 described above.

Prior to the preprocessing step of step 2, surface treatment for the purpose of cleaning the substrate surface may be performed. An example of the surface treatment includes a process of supplying, for example, a $H_2$ gas, or both an Ar gas and the $H_2$ gas while heating the substrate to a temperature of 300 to 600 degrees C. At this time, plasma may be generated.

<Processing Apparatus>

Next, examples of a processing apparatus suitable for implementing the graphene structure forming method according to the above-described embodiment will be described.

First Example of Processing Apparatus

Figure 5:
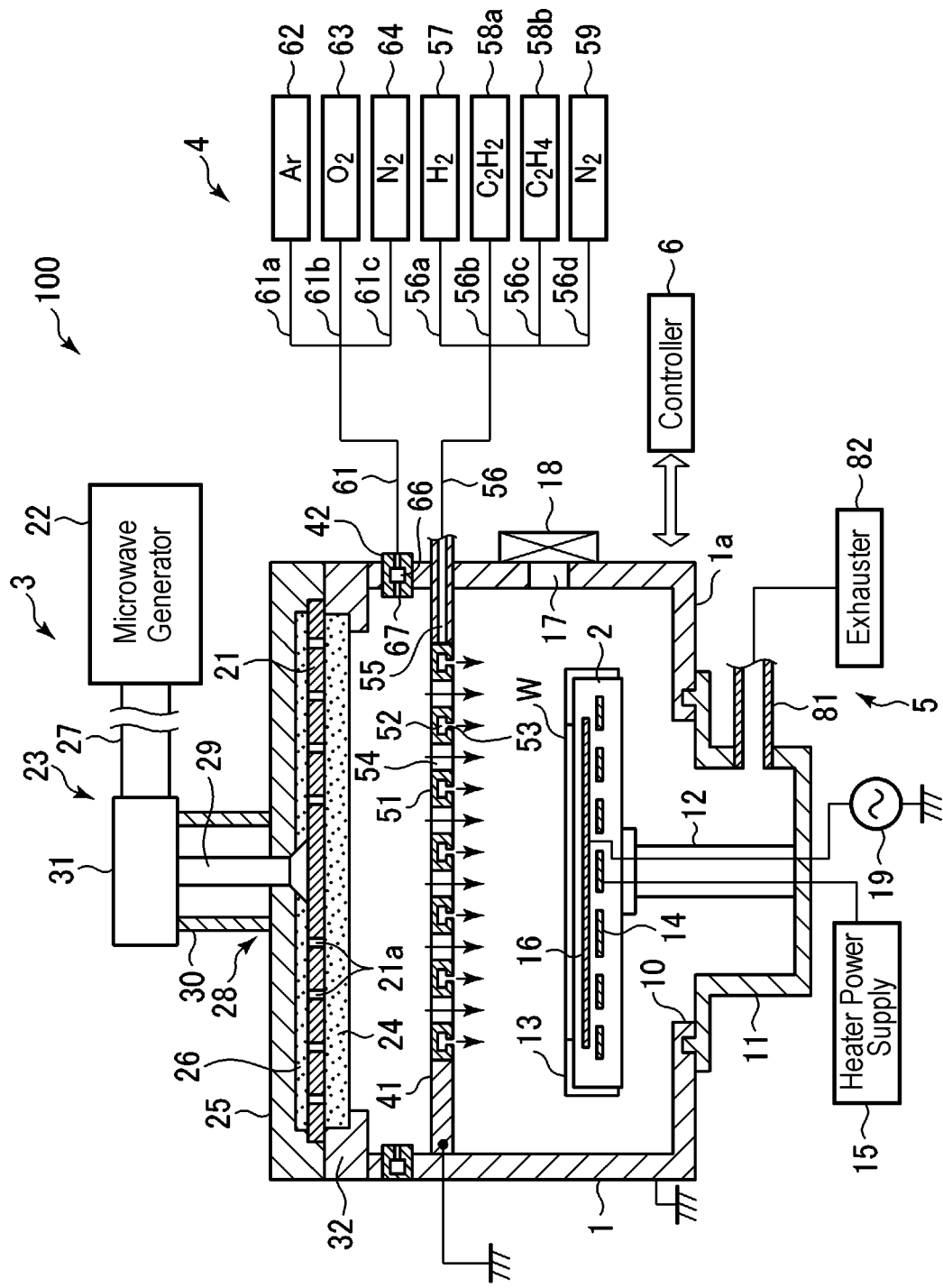
FIG. 5 is a cross-sectional view illustrating a first example of a processing apparatus suitable for implementing the graphene structure forming method according to the embodiment of the present disclosure.

FIG. 5 is a cross-sectional view schematically illustrating a first example of the processing apparatus. A processing apparatus 100 illustrated in FIG. 5 is configured as, for example, an RLSA (registered trademark) microwave plasma-type plasma processing apparatus.

The processing apparatus 100 includes a processing container 1, a stage 2, a microwave introduction mechanism 3, a gas supply mechanism 4, an exhauster 5, and a controller 6.

The processing container 1 has a substantially cylindrical shape. A circular opening 10 is formed in a substantially central portion of a bottom wall 1a of the processing container 1. An exhaust chamber 11 is provided in the bottom wall 1a to communicate with the opening 10 and to protrude downward. The side wall of the processing container 1 is provided with a loading/unloading port 17 for loading/unloading a wafer W, and a gate valve 18 for opening/closing the loading/unloading port 17.

The stage 2 is provided inside the processing container 1. For example, a semiconductor wafer (hereinafter simply referred to as a "wafer") W as a substrate is placed on the stage 2. The stage 2 has a disk shape and is made of ceramic, such as AlN. The stage 2 is supported by a cylindrical support member 12 made of ceramic, such as AlN, and extending upward from the center of the bottom of the exhaust chamber 11. A guide ring 13 configured to guide the wafer W is provided on the outer edge of the stage 2. In addition, inside the stage 2, lifting pins (not illustrated) for raising/lowering the wafer W are provided to be moved upward or downward with respect to the top surface of the stage 2. In addition, a resistance heater 14 is embedded in the stage 2. The heater 14 is supplied with power from a heater power supply 15 and heats the wafer W placed on the stage 2 via the stage 2. A thermocouple (not illustrated) is inserted into the stage 2. The heating temperature of the wafer W can be controlled to a predetermined temperature in the range of, for example, 300 to 1,000 degrees C., based on a signal from the thermocouple. In addition, an electrode 16 having a size similar to that of the wafer W is embedded above the heater 14 in the stage 2. A high-frequency bias power supply 19 is electrically connected to the electrode 16. A high-frequency bias for attracting ions is applied from the high-frequency bias power supply 19 to the stage 2. The high-frequency bias power supply 19 may not be provided, depending on the characteristics of plasma processing.

The microwave introduction mechanism 3 is configured to introduce microwaves into the processing container 1, and is provided to face an opening in the upper portion of the processing container 1. The microwave introduction mechanism 3 includes a planar slot antenna 21, a microwave generator 22, and a microwave transmission mechanism 23.

The planar slot antenna 21 is made of, for example, a copper plate or an aluminum plate having a silver or gold-plated surface, and has a configuration in which a plurality of slots 21a for radiating microwaves are formed to penetrate the plate in a predetermined pattern. The pattern of the slots 21a is appropriately set such that the microwaves are evenly radiated. An example of a suitable pattern includes a radial line slot in which a plurality of pairs of slots 21a are concentrically arranged, and the two slots 21a in each pair are arranged in a T shape. The lengths and the arrangement intervals of the slots 21a are appropriately determined according to an effective wavelength kg of microwaves. The slots 21a may have another shape, such as a circular shape or an arc shape. The arrangement form of the slots 21a is not particularly limited, and the slots 21a may be arranged, for example, in a spiral shape or a radial shape, in addition to the concentric circle shape. The pattern of the slots 21a is appropriately set to have a microwave radiation characteristic that can obtain a desired plasma density distribution.

A microwave transmission plate 24 made of a dielectric material is provided below the planar slot antenna 21 to be supported by an upper plate 32 provided in a ring shape in the upper portion of the processing container 1. A water-cooled shield member 25 is provided on the planar slot antenna 21. In addition, a slow-wave material 26 is provided between the shield member 25 and the planar slot antenna 21.

The slow-wave material 26 is made of a dielectric material having a dielectric constant greater than that of a vacuum, for example, quartz, ceramic ($Al_2O_3$), or a resin such as polytetrafluoroethylene or polyimide. The slow-wave material 26 functions to make the wavelength of the microwaves shorter than that in a vacuum, thereby reducing the size of the planar slot antenna 21. The microwave transmission plate 24 is also made of the same dielectric material.

The thicknesses of the microwave transmission plate 24 and the slow-wave material 26 are adjusted such that an equivalent circuit formed by the slow-wave material 26, the planar slot antenna 21, the microwave transmission plate 24, and the plasma satisfies resonance conditions. By adjusting the thickness of the slow-wave material 26, it is possible to adjust the phase of microwaves. By adjusting the thickness of the planar slot antenna such that a joint portion of the planar slot antenna 21 becomes an "antinode" of a standing wave, the reflection of microwaves is minimized and the radiant energy of microwaves is maximized. In addition, when the slow-wave material 26 and the microwave transmission plate 24 are made of the same material, it is possible to prevent the interface reflection of microwaves.

The microwave generator 22 is configured to generate microwaves, and has a microwave oscillator. The microwave oscillator may be a magnetron oscillator or a solid-state oscillator. The frequency of microwaves oscillated from the microwave oscillator may be in the range of 300 MHz to 10 GHz. For example, by using the magnetron oscillator as the microwave oscillator, it is possible to oscillate microwaves having a frequency of 2.45 GHz.

The microwave transmission mechanism 23 is configured to guide the microwaves from the microwave generator 22 to the planar slot antenna 21. The microwave transmission mechanism 23 includes a waveguide 27, a coaxial waveguide 28, and a mode conversion mechanism 31. The waveguide 27 guides the microwaves from the microwave generator 22 and extends in the horizontal direction. The coaxial waveguide 28 includes an inner conductor 29 extending upward from the center of the planar slot antenna 21 and an outer conductor 30 provided outside the inner conductor 29. The mode conversion mechanism 31 is provided between the waveguide 27 and the coaxial waveguide 28, and is configured to convert a microwave vibration mode. The microwaves generated by the microwave generator 22 propagate through the waveguide 27 in a TE mode, the microwave vibration mode is converted from the TE mode to a TEM mode by the mode conversion mechanism 31, and the microwaves are guided to the slow-wave material 26 through the coaxial waveguide 28. Then, the microwaves are radiated from the slow-wave material 26 into the processing container 1 via the slots 21a of the planar slot antenna 21 and the microwave transmission plate 24. A tuner (not illustrated) is provided in the waveguide 27 to match the impedance of a load (plasma) in the processing container 1 with the characteristic impedance of the power supply of the microwave generator 22.

The gas supply mechanism 4 includes a shower plate 41 horizontally provided above the stage inside the processing container 1 to partition upper and lower portions of the interior of the processing container 1, and a shower ring 42 provided above the shower plate 41 in a ring shape along the inner wall of the processing container 1.

The shower plate 41 includes grid-shaped gas flow members 51, grid-shaped gas flow paths 52 provided inside the gas flow members 51, respectively, and a large number of gas ejection holes 53 extending downward from the gas flow paths 52, respectively. A through hole 54 is formed between adjacent grid-shaped gas flow members 51. A gas supply path 55 reaching the outer wall of the processing container 1 extends in the gas flow paths 52 of the shower plate 41, and a gas supply pipe 56 is connected to the gas supply path 55. The gas supply pipe 56 branches into four branch pipes 56a, 56b, 56c, and 56d. A $H_2$ gas source 57 is connected to the branch pipe 56a to supply a $H_2$ gas as a hydrogen-containing gas. A $C_2H_2$ gas source 58a is connected to the branch pipe 56b to supply an acetylene ($C_2H_2$) gas as the carbon-containing gas used for the first processing gas. A $C_2H_4$ gas source 58b is connected to the branch pipe 56c to supply an ethylene ($C_2H_4$) gas as the carbon-containing gas used for the second processing gas. A $N_2$ gas source 59 is connected to the branch pipe 56d to supply a $N_2$ gas used as a purge gas or the like. Although not illustrated, each of the branch pipes 56a, 56b, 56c, and 56d includes a mass flow controller for flow rate control, and valves provided on front and back side of the mass flow controller.

The shower ring 42 includes a ring-shaped gas flow path 66 provided therein and a large number of gas ejection holes 67 connected to the gas flow path 66 and opened to the interior of the gas flow path 66, and a gas supply pipe 61 is connected to the gas flow path. The gas supply pipe 61 branches into three branch pipes 61a, 61b, and 61c. An Ar gas source 62 is connected to the branch pipe 61a to supply an Ar gas as a noble gas serving as a plasma generation gas. An $O_2$ gas source 63 is connected to the branch pipe 61b to supply an $O_2$ gas as an oxidizing gas for etching a defect (non-graphene structure). An $N_2$ gas source 64 is connected to the branch pipe 61c to supply a $N_2$ gas used as a purge gas or the like. Although not illustrated, each of the branch pipes 61a, 61b, and 61c includes a mass flow controller for flow rate control and valves provided on front and back sides of the mass flow controller. The carbon-containing gas, the oxidizing gas, and the noble gas are not limited to the gases described herein, and various gases described above may be used.

The exhauster 5 is configured to evacuate the gas inside the processing container 1, and includes the exhaust chamber 11, an exhaust pipe 81 provided in the side surface of the exhaust chamber 11, and an exhaust device 82 having a vacuum pump connected to the exhaust pipe 81, a pressure control valve, and the like.

The controller 6 is typically configured with a computer, and controls each part of the processing apparatus 100. The controller 6 includes a storage part that stores a process sequence of the processing apparatus 100 and process recipes as control parameters, an input means, a display and the like, and is able to perform a predetermined control according to a selected process recipe.

When forming a graphene structure according to the above-described embodiment using the processing apparatus 100 configured as described above, first, the wafer W as a substrate is loaded into the processing container 1 and placed on the stage 2. The surface of the wafer W is cleaned as needed.

Preferable conditions for this cleaning process are as follows.
  Gas flow rate: Ar/$H_2$=0 to 2,000 sccm/10 to 2,000 sccm
  Pressure: 0.1 to 10 Torr (13.3 to 1,333 Pa)
  Wafer temperature: 300 to 600 degrees C.
  Time: 10 to 120 min Subsequently, the internal pressure of the processing container 1 and the wafer temperature are controlled to predetermined values, and the first processing gas including the carbon-containing gas is supplied to the substrate to perform the preprocessing in Step 2. Specifically, as the first processing gas, an Ar gas, which is a noble gas, is supplied from the shower ring 42, and a $C_2H_2$ gas as a carbon-containing gas is supplied from the shower plate 41. At this time, a $H_2$ gas may be supplied as needed. The preprocessing in step 2 forms nuclei of the graphene structure on the surface of the substrate.

Preferable conditions for the preprocessing in step 2 are as follows.
  Gas Flow Rate:
    Ar gas=0 to 1,000 sccm
    $C_2H_2$ gas=0.1 to 100 sccm
    $H_2$ gas=0 to 300 sccm
  Pressure: 1.33 to 133 Pa (0.01 to 1 Torr)
  Temperature: 300 to 1,000 degrees C. (more preferably, 350 to 750 degrees C.)
  Time: 1 to 10 min Subsequently, the internal pressure of the processing container 1 and the wafer temperature are controlled to predetermined values, and the graphene structure is formed through the remote microwave plasma CVD in step 3.

Specifically, an Ar gas as a plasma generation gas is supplied from the shower ring 42 to a position directly below the microwave transmission plate 24, and microwaves generated by the microwave generator 22 are radiated into the processing container 1 to ignite plasma. The microwaves generated by the microwave generator 22 are guided to the slow-wave material 26 via the waveguide 27, the mode conversion mechanism 31, and the coaxial waveguide 28, and are radiated into the processing container 1 from the slow-wave material 26 via the slots 21a of the planar slot antenna 21 and the microwave transmission plate 24.

The microwaves spread as surface waves to a region directly below the microwave transmission plate 24 so that surface wave plasma is generated by the Ar gas. This region becomes a plasma generation region.

Subsequently, at the time at which the plasma is ignited, the $C_2H_4$ gas as a carbon-containing gas serving as a film-forming raw material gas is supplied from the shower plate 41. At this time, a $H_2$ gas and an $O_2$ gas may be supplied as needed.

These gases are excited and dissociated by the plasma diffused from the plasma generation region, and are supplied to the wafer W as a substrate placed on the stage 2 below the shower plate 41. Since the wafer W is arranged in a region spaced apart from the plasma generation region and the plasma diffused from the plasma generation region is supplied to the wafer W, the plasma has a low electron temperature on the wafer W and thus causes little damage to the wafer W, and the plasma is turned into high-density plasma mainly composed of radicals. With such plasma, a graphene structure can be formed on the surface of the substrate on which the nuclei are formed according to a general crystal growth mode of nucleation and creeping growth.

At this time, the $C_2H_4$ gas as a carbon-containing gas and, if necessary, the $H_2$ gas are supplied to a location below the plasma generation region from the shower plate 41 and are dissociated by the diffused plasma. Thus, it is possible to suppress excessive dissociation of these gases. However, these gases may be supplied to the plasma generation region. In addition, the Ar gas as a plasma generation gas may not be used, and, for example, the $C_2H_4$ gas as a carbon-containing gas may be supplied to the plasma generation region to directly ignite the plasma.

Preferable conditions for the remote microwave plasma CVD in the processing apparatus 100 are as follows.
  Gas Flow Rate:
    Ar gas=0 to 2,000 sccm
    $C_2H_4$ gas=0.1 to 300 sccm
    $O_2$ gas=0 to 10 sccm
    $H_2$ gas=0 to 500 sccm
  Pressure:
    1.33 to 667 Pa (0.01 to 5 Torr) when the surface of the wafer is an insulator or a semiconductor
    1.33 to 400 Pa (0.01 to 3 Torr) when the surface of the wafer is a metal (not having a catalytic function)
  Temperature: 350 to 1,000 degrees C. (more preferably, 400 to 800 degrees C.)
  Microwave power: 100 to 5,000 W (more preferably, 1,000 to 3,500 W)
  Time: 1 to 200 min The carbon-containing gas in the first processing gas and the carbon-containing gas in the second processing gas may be the same gas and may be both, for example, the $C_2H_2$ gas. In that case, the $C_2H_4$ gas source 58b is unnecessary.

Second Example of Processing Apparatus

Figure 6:
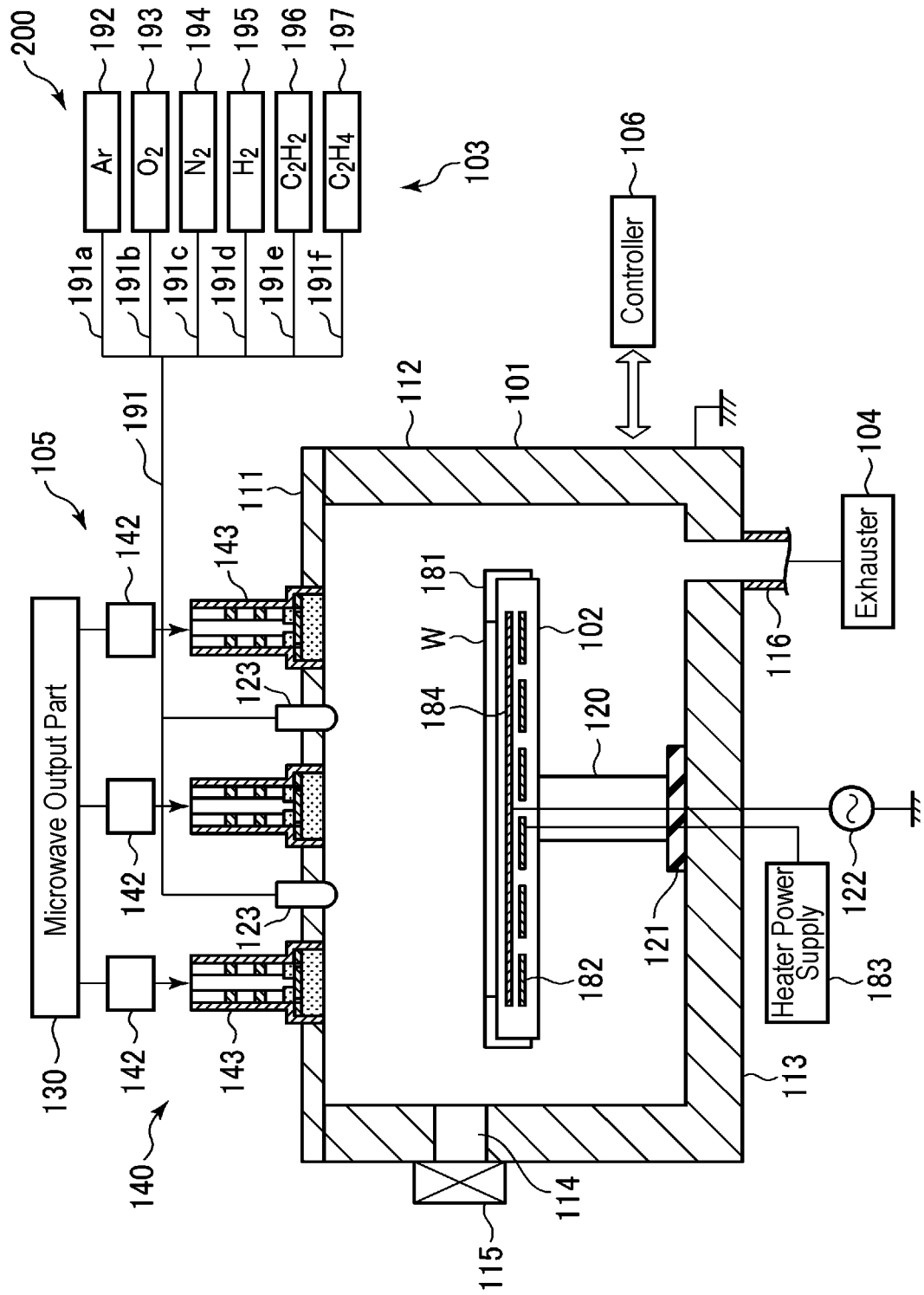
FIG. 6 is a cross-sectional view illustrating a second example of the processing apparatus suitable for implementing the graphene structure forming method according to the embodiment of the present disclosure.
Figure 7:
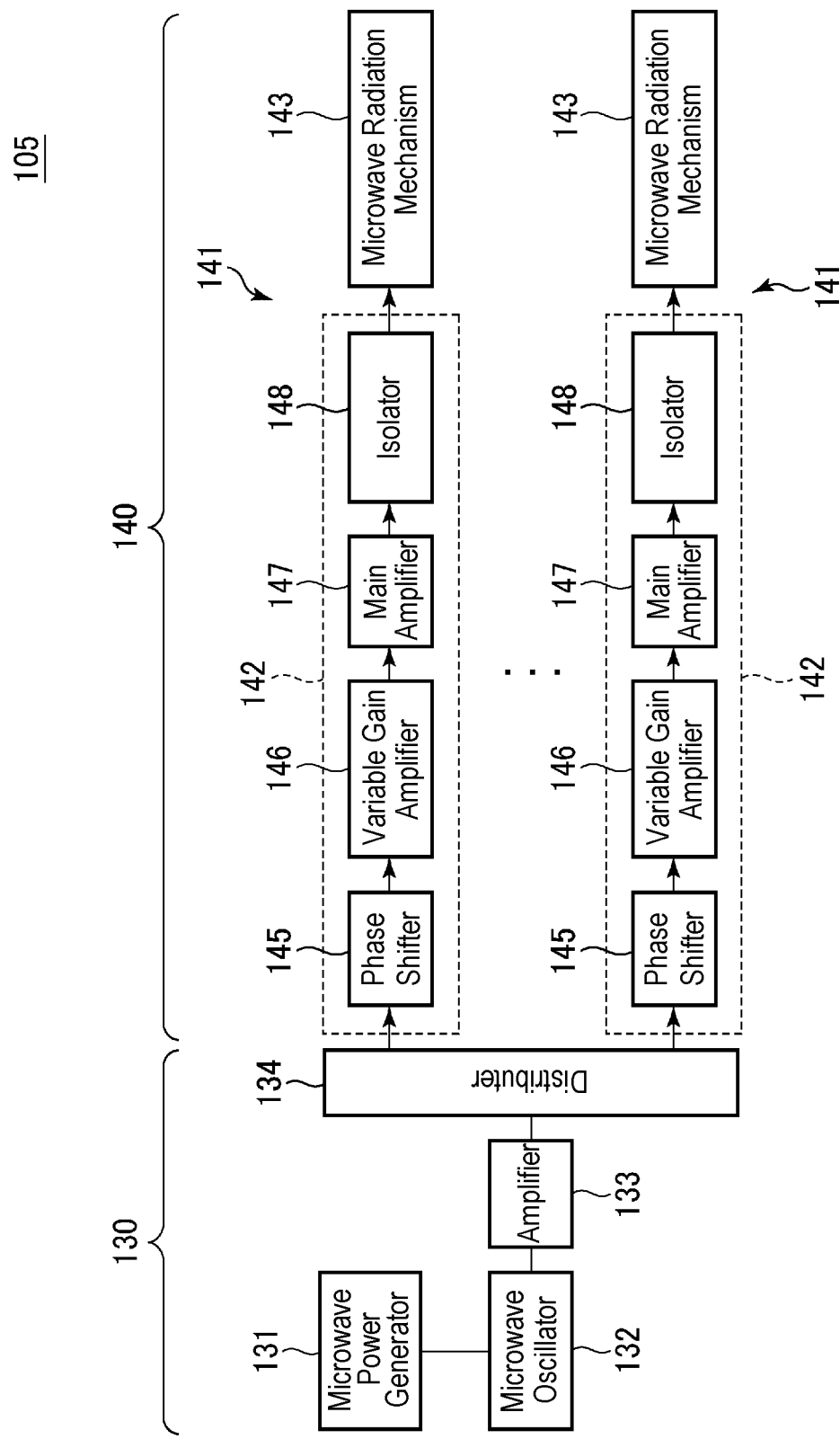
FIG. 7 is a block diagram illustrating a configuration of a microwave introduction device in the processing apparatus of FIG. 6.
Figure 8:
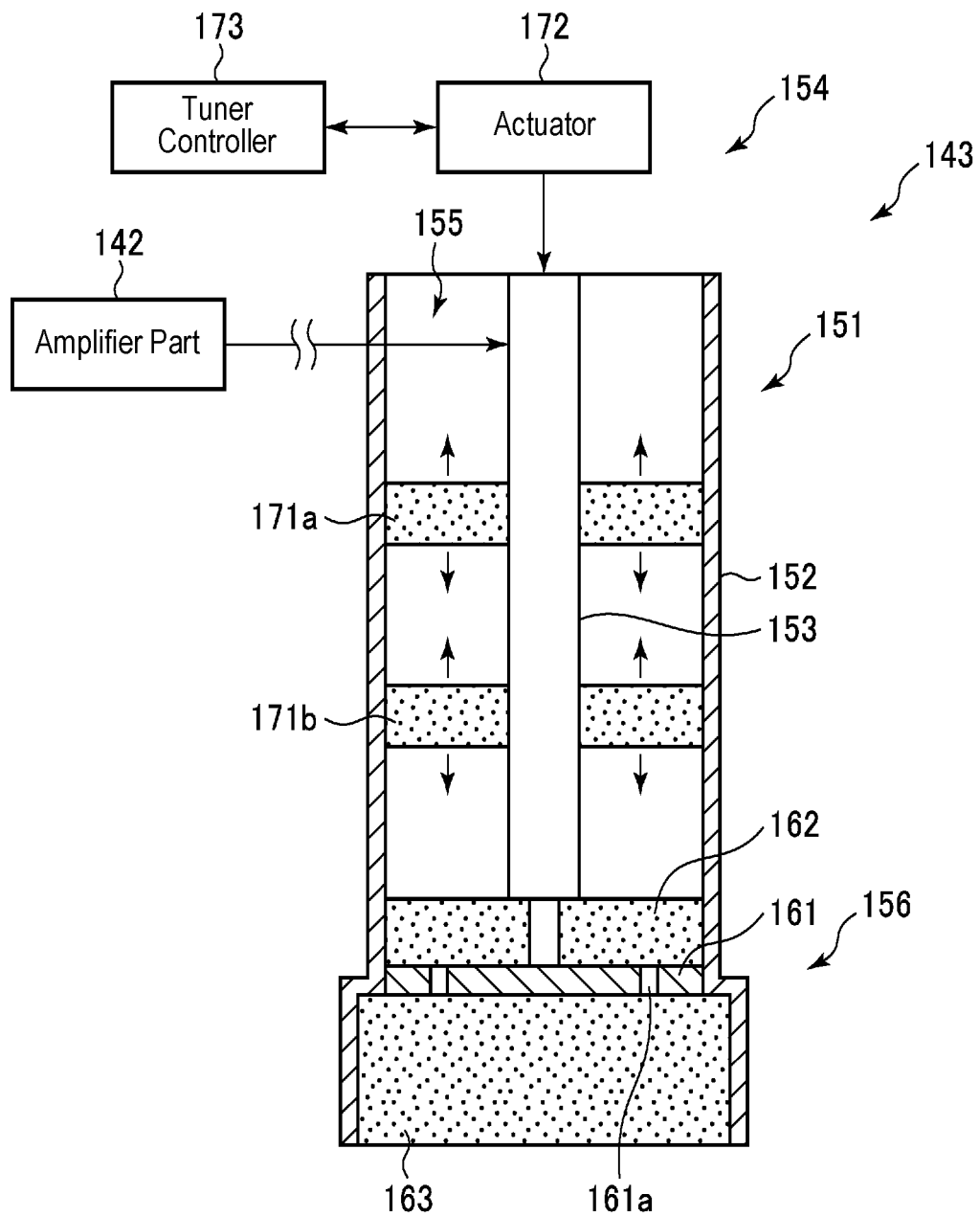
FIG. 8 is a cross-sectional view schematically illustrating the microwave radiation mechanism in the processing apparatus of FIG. 6.
Figure 9:
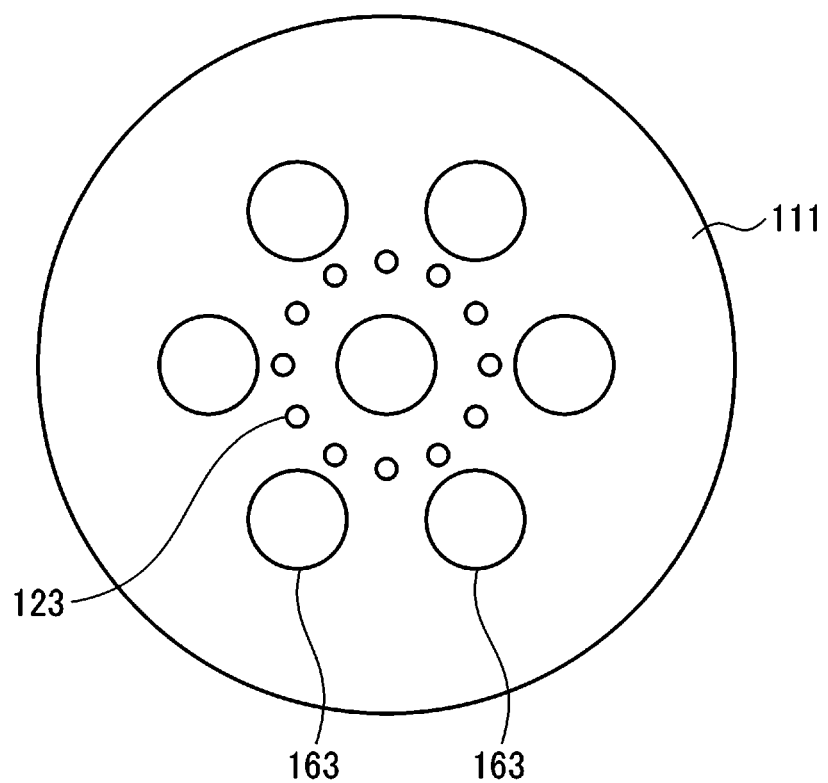
FIG. 9 is a bottom view schematically illustrating a ceiling wall of a processing container in the processing apparatus of FIG. 6.

FIG. 6 is a cross-sectional view schematically illustrating a second example of the processing apparatus, FIG. 7 is a block diagram illustrating a configuration of a microwave introduction device in the processing apparatus of FIG. 6, FIG. 8 is a cross-sectional view schematically illustrating a microwave radiation mechanism in the processing apparatus of FIG. 6, and FIG. 9 is a bottom view schematically illustrating a ceiling wall of a processing container in the processing apparatus of FIG. 6.

A processing apparatus 200 includes a processing container 101, a stage 102, a gas supply mechanism 103, an exhaust device 104, a microwave introduction device 105, and a controller 106.

The processing container 101 is configured to accommodate the wafer W, is formed of, for example, a metal material, such as aluminum or an alloy thereof, and has a substantially cylindrical shape. The processing container 101 includes a plate-shaped ceiling wall 111, a bottom wall 113, and a side wall 112 connecting the ceiling wall 111 and the bottom wall 113 to each other. The microwave introduction device 105 is provided above the processing container 101, and functions as a plasma generating means that introduces electromagnetic waves (microwaves) into the processing container 101 so as to generate plasma. The microwave introduction device 105 will be described in detail later.

The ceiling wall 111 has a plurality of openings into which a microwave radiation mechanism and a gas introduction part of the microwave introduction device 105 to be described later are fitted. The side wall 112 has a loading/unloading port 114 for loading/unloading therethrough the wafer W as a substrate into and from a transfer chamber (not illustrated) adjacent to the processing container 101. The loading/unloading port 114 is opened/closed by a gate valve 115. The bottom wall 113 is provided with the exhaust device 104. The exhaust device 104 is provided in an exhaust pipe 116 connected to the bottom wall 113 and includes a vacuum pump and a pressure control valve. By the vacuum pump of the exhaust device 104, the gas inside the processing container 101 is exhausted through the exhaust pipe 116. The internal pressure of the processing container 101 is controlled by the pressure control valve.

The stage 102 is disposed inside the processing container 101 to place the wafer W thereon. The stage 102 has a disk shape and is made of ceramic, such as AlN. The stage 102 is supported by a cylindrical support member 120 made of ceramic, such as AlN, and extending upward from the center of the bottom of the processing container 101. A guide ring 181 configured to guide the wafer W is provided on the outer edge of the stage 102. In addition, inside the stage 102, lifting pins (not illustrated) for raising/lowering the wafer W are provided to be moved upward or downward with respect to the top surface of the stage 102. A resistance heater 182 is embedded in the stage 102. The heater 182 heats the wafer W placed on the stage 102 via the stage 102 by being supplied with power from a heater power supply 183. A thermocouple (not illustrated) is inserted into the stage 102. The heating temperature of the wafer W can be controlled to a predetermined temperature in the range of, for example, 350 to 1,000 degrees C., based on a signal from the thermocouple. In addition, an electrode 184 having a size similar to that of the wafer W is embedded above the heater 182 in the stage 102. A high-frequency bias power supply 122 is electrically connected to the electrode 184. A high-frequency bias for attracting ions is applied from the high-frequency bias power supply 122 to the stage 102. The high-frequency bias power supply 122 may not be provided, depending on the characteristics of plasma processing.

The gas supply mechanism 103 is configured to introduce a plasma generation gas and a raw material gas for forming a graphene structure into the processing container 101 and includes a plurality of gas introduction nozzles 123. The gas introduction nozzles 123 are fitted into respective openings formed in the ceiling wall 111 of the processing container 101. A gas supply pipe 191 is connected to the gas introduction nozzles 123. The gas supply pipe 191 branches into six branch pipes 191a, 191b, 191c, 191d, 191e, and 191f. An Ar gas source 192 is connected to the branch pipe 191a to supply an Ar gas as a noble gas serving as a plasma generation gas. An $O_2$ gas source 193 is connected to the branch pipe 191b to supply an $O_2$ gas as an oxidizing gas. A $N_2$ gas source 194 is connected to the branch pipe 191c to supply a $N_2$ gas used as a purge gas or the like. A $H_2$ gas source 195 is connected to the branch pipe 191d to supply a $H_2$ gas as a hydrogen-containing gas. A $C_2H_2$ gas source 196 is connected to the branch pipe 191e to supply an acetylene ($C_2H_2$) gas as the carbon-containing gas used for the first processing gas. A $C_2H_4$ gas source 197 is connected to the branch pipe 191f to supply an ethylene ($C_2H_4$) gas as the carbon-containing gas used for the second processing gas. Although not illustrated, each of the branch pipes 191a, 191b, 191c, 191d, 191e, and 191f includes a mass flow controller for flow rate control and valves provided on front and back sides of the mass flow controller. As in the first example, it is possible to adjust the dissociation of gas by providing a shower plate and supplying, for example, the $C_2H_4$ gas, to a position close to the wafer W. The same effects can also be obtained by extending nozzles configured to supply these gases downward. As in the first example, the carbon-containing gas, the oxidizing gas, and the noble gas are not limited to the aforementioned gases, and various gases described above may be used.

As described above, the microwave introduction device 105 is provided above the processing container 101, and functions as a plasma generating means that introduces electromagnetic waves (microwaves) into the processing container 101 to generate plasma. As illustrated in FIG. 6, the microwave introduction device 105 includes a ceiling wall 111 of the processing container 101, which functions as a ceiling plate, a microwave output part 130, and an antenna unit 140.

The microwave output part 130 generates microwaves, and distributes and outputs the microwaves to a plurality of routes. As illustrated in FIG. 7, the microwave output part 130 includes a microwave power supply 131, a microwave oscillator 132, an amplifier 133, and a distributor 134. The microwave oscillator 132 is a solid-state oscillator and oscillates microwaves at, for example, 860 MHz (e.g., PLL oscillation). The frequency of microwaves is not limited to 860 MHz, and may be in the range of 700 MHz to 10 GHz, such as 2.45 GHz, 8.35 GHz, 5.8 GHz, or 1.98 GHz. The amplifier 133 amplifies microwaves oscillated by the microwave oscillator 132. The distributor 134 distributes microwaves amplified by the amplifier 133 to the plurality of routes, and distributes the microwaves while matching the impedances on the input side and the output side.

The antenna unit 140 introduces the microwaves output from the microwave output part 130 into the processing container 101. The antenna unit 140 includes a plurality of antenna modules 141, as illustrated in FIG. 7. Each of the plurality of antenna modules 141 introduces the microwaves distributed by the distributor 134 into the processing container 101. The configurations of all of the antenna modules 141 are the same. Each antenna module 141 includes an amplifier part 142 configured mainly to amplify and output the distributed microwaves, and a microwave radiation mechanism 143 configured to radiate, into the processing container 101, the microwaves output from the amplifier part 142.

The amplifier part 142 includes a phase shifter 145, a variable gain amplifier 146, a main amplifier 147, and an isolator 148. The phase shifter 145 changes a phase of microwaves. The variable gain amplifier 146 adjusts a power level of the microwaves input to the main amplifier 147. The main amplifier 147 is configured as a solid-state amplifier. The isolator 148 separates reflected microwaves, which are reflected from an antenna part of the microwave radiation mechanism 143 (to be described later) and are directed toward the main amplifier 147.

As illustrated in FIG. 6, a plurality of microwave radiation mechanisms 143 are provided on the ceiling wall 111. As illustrated in FIG. 8, each microwave radiation mechanism 143 includes a coaxial tube 151, a power feeder 155, a tuner 154, and an antenna part 156. The coaxial tube 151 includes a cylindrical outer conductor 152, an inner conductor 153 provided inside the outer conductor 152 coaxially with the outer conductor 152, and a microwave transmission path provided between the outer conductor 152 and the inner conductor 153.

The power feeder 155 feeds the amplified microwaves from the amplifier part 142 to the microwave transmission path. The microwaves amplified by the amplifier part 142 are introduced into the power feeder 155 from a lateral side of an upper end portion of the outer conductor 152 via a coaxial cable. For example, by radiating the microwaves from the power feeding antenna, microwave power is fed to the microwave transmission path between the outer conductor 152 and the inner conductor 153 and propagates toward the antenna part 156.

The antenna part 156 radiates microwaves from the coaxial tube 151 into the processing container 101, and is provided in a lower end portion of the coaxial tube 151. The antenna part 156 includes a disk-like planar antenna 161, which is connected to a lower end portion of the inner conductor 153, a slow-wave material 162 disposed on the side of the top surface of the planar antenna 161, and a microwave transmission plate 163 disposed on the side of the bottom surface of the planar antenna 161. The microwave transmission plate 163 is fitted into the ceiling wall 111, and the bottom surface thereof is exposed to the internal space of the processing container 101. The planar antenna 161 has slots 161a formed to penetrate therethrough. The shape of each slot 161a is appropriately set such that microwaves are efficiently radiated. A dielectric material may be inserted into each slot 161a. The slow-wave material 162 is formed of a material having a dielectric constant higher than a vacuum, and the phase of microwaves can be adjusted based on the thickness of the slow-wave material 162 so that the radiation energy of the microwaves can be maximized. The microwave transmission plate 163 is also made of a dielectric material, and has a shape capable of efficiently radiating microwaves in a TE mode. Then, the microwaves transmitted through the microwave transmission plate 163 generate plasma in the internal space of the processing container 101. As a material for constituting the slow-wave material 162 and the microwave transmission plate 163, for example, quartz, ceramic, a fluorine-based resin such as a polytetrafluoroethylene resin, a polyimide resin or the like, may be used.

The tuner 154 matches the impedance of a load with the characteristic impedance of the microwave power supply 131. The tuner 154 constitutes a slug tuner. For example, as illustrated in FIG. 8, the tuner 154 includes two slugs 171a and 171b, an actuator 172 configured to independently drive these two slugs 171a and 171b, and a tuner controller 173 configured to control the actuator 172. The slugs 171a and 171b are arranged in a portion closer to the proximal end (upper end) than the antenna part 156 of the coaxial tube 151.

The slugs 171a and 171b have an annular plate shape, are made of a dielectric material such as ceramic, and are disposed between the outer conductor 152 and the inner conductor 153 of the coaxial tube 151. In addition, the actuator 172 individually drives each of the slugs 171a and 171b, for example, by rotating two screws, which are provided inside the inner conductor 153 and to which the slugs 171a and 171b are screwed, respectively. Then, based on a command from the tuner controller 173, the actuator 172 moves the slugs 171a and 171b in the vertical direction. The tuner controller 173 adjusts positions of the slugs 171a and 171b such that the impedance at the terminal end portions thereof becomes 50Ω.

The main amplifier 147, the tuner 154, and the planar antenna 161 are arranged close to each other. The tuner 154 and the planar antenna 161 constitute a lumped constant circuit and also function as a resonator. Impedance mismatch exists in the portion in which the planar antenna 161 is mounted, but since the impedance mismatch is directly tuned by the tuner 154 with respect to plasma load, it is possible to tune the impedance mismatch including plasma with high precision. Therefore, the influence of reflection on the planar antenna 161 can be eliminated.

As illustrated in FIG. 9, in this example, seven microwave radiation mechanisms 143 are provided, and microwave transmission plates 163 corresponding to the seven microwave radiation mechanisms 143 are provided so as to be evenly arranged in a closely packed hexagonal structure. That is, one of the seven microwave transmission plates 163 is arranged in the center of the ceiling wall 111, and the other six microwave transmission plates 163 are arranged therearound. These seven microwave transmission plates 163 are arranged such that adjacent microwave transmission plates are evenly spaced apart from each other. In addition, the plurality of gas introduction nozzles 123 of the gas supply mechanism 103 are arranged to surround the periphery of the central microwave transmission plate. The arrangement of the microwave radiation mechanisms 143 is not limited thereto, and the number of microwave radiation mechanisms 143 is not limited to seven.

The controller 106 is typically configured with a computer, and controls each part of the processing apparatus 200. The controller 106 includes a storage part that stores a process sequence of the processing apparatus 200 and process recipes as control parameters, an input part, a display and the like, and is able to perform predetermined control according to a selected process recipe.

When forming a graphene structure according to the above-described embodiment using the processing apparatus 200 configured as described above, first, as a substrate, for example, the wafer W having a surface made of an insulator, a semiconductor, or a metal is loaded into the processing container 101 and placed on the stage 102. The surface of the wafer W is cleaned as needed.

Preferable conditions for this surface treatment are as follows.

Gas flow rate: $Ar/H_2$=0 to 2,000 sccm/10 to 2,000 sccm
Pressure: 0.1 to 10 Torr (13.3 to 1,333 Pa)
Wafer temperature: 300 to 600 degrees C.
Time: 10 to 120 min Subsequently, the internal pressure of the processing container 101 and the wafer temperature are controlled to predetermined values, and the first processing gas including the carbon-containing gas is supplied to the substrate to perform the preprocessing in step 2. Specifically, an Ar gas as the noble gas and a $C_2H_2$ gas as the carbon-containing gas are supplied from the gas introduction nozzles 123 as the first processing gas. At this time, a $H_2$ gas may be supplied as needed. Nuclei of the graphene structure are formed on the surface of the substrate through step 2.

Preferable conditions for the preprocessing in step 2 are as follows.

Gas Flow Rate:
    Ar gas=0 to 1,000 sccm
    $C_2H_2$ gas=0.1 to 100 sccm
    $H_2$ gas=0 to 300 sccm
Pressure: 1.33 to 133 Pa (0.01 to 1 Torr)
Temperature: 300 to 1,000 degrees C. (more preferably, 350 to 750 degrees C.)
Time: 1 to 10 min Subsequently, the internal pressure of the processing container 101 and the wafer temperature are controlled to predetermined values, and the graphene structure is formed through the remote microwave plasma CVD in step 3.

Specifically, from the gas introduction nozzles 123, an Ar gas as the plasma generation gas is supplied to a position directly below the ceiling wall 111 of the processing container 101, and microwaves are radiated into the processing container 101 to ignite plasma. The radiated microwaves are those output distributedly into the plurality of routes from the microwave output part 130 of the microwave introduction device 105, guided into the plurality of antenna modules 141 of the antenna unit 140, and radiated from the microwave radiation mechanisms 143.

In each antenna module 141, the microwaves are individually amplified by the main amplifier 147 constituting the solid-state amplifier, fed to each microwave radiation mechanism 143, and transmitted to the coaxial tube 151, thereby reaching the antenna part 156. At that time, the impedances of the microwaves are automatically matched by the slugs 171a and 171b of the tuner 154. Therefore, in the state in which there is substantially no power reflection, the microwaves are radiated from the tuner 154 through the slow-wave material 162 of the antenna part and from the slots 161a of the planar antenna 161. Then, the microwaves further pass through the microwave transmission plate 163 and are transmitted to the surface (bottom surface) of the microwave transmission plate 163, which is in contact with the plasma, thereby forming surface waves. The electric power from each antenna part 156 is spatially synthesized inside the processing container 101, and surface wave plasma is generated by the Ar gas in a region directly below the ceiling wall 111. This region becomes a plasma generation region.

Then, at the time at which the plasma is ignited, the $C_2H_4$ gas as the carbon-containing gas serving as a film-forming raw material gas is supplied from the gas introduction nozzle 123. At this time, a $H_2$ gas and an $O_2$ gas may be supplied as needed.

These gases are excited by plasma, dissociated, and supplied to the wafer W, which is the substrate placed on the stage 102. Since the wafer W is arranged in a region spaced apart from the plasma generation region and the plasma diffused from the plasma generation region is supplied to the wafer W, the plasma has a low electron temperature on the wafer W and thus causes little damage to the wafer W, and the plasma is turned into high-density plasma mainly composed of radicals. With such plasma, a graphene structure can be formed according to a general crystal growth mode of nucleation and creeping growth.

In this example, the $C_2H_4$ gas as the carbon-containing gas and, if necessary, the $H_2$ gas are supplied to the plasma generation region and dissociated. However, by using the same shower plate as in the first example or extending the gas introduction nozzle, the $C_2H_4$ gas and, if necessary, the $H_2$ gas may be dissociated by plasma diffused from the plasma generation region to suppress the dissociation. In addition, the Ar gas as the plasma generation gas may not be used, and, for example, the $C_2H_4$ gas as the carbon-containing gas may be supplied to the plasma generation region to directly ignite the plasma.

In the processing apparatus 200 of this example, the microwaves distributed into a plurality of routes are individually amplified by each main amplifier 147 constituting a solid-state amplifier, and are individually introduced into the processing container 101 from the plurality of antenna parts 156, thereby forming surface waves. Then, the surface waves are synthesized in the internal space of the processing container 101 to generate microwave plasma. Therefore, a large-sized isolator or synthesizer is not required, and the processing apparatus can be made compact. In addition, the main amplifier 147, the tuner 154, and the planar antenna 161 are provided close to each other, and the tuner 154 and the planar antenna 161 constitute a lumped constant circuit and also function as a resonator. This makes it possible to tune the flat slot antenna mounting portion in which impedance mismatching exists, including plasma using the tuner 154 with high precision. Therefore, it is possible to reliably eliminate the influence of reflection, which enables high-precision plasma control. In addition, since the plurality of microwave transmission plates 163 are provided, the total area may be made smaller than that of the single microwave transmission plate 24 in the processing apparatus of the first example. This makes it possible to reduce the microwave power that is required to stably ignite and discharge plasma.

Preferable conditions for the remote microwave plasma CVD in the processing apparatus 200 are basically the same as those in the first example, but preferable conditions of some items are different from each other. The preferable conditions are as follows.

Gas Flow Rate:
    Ar gas=0 to 2,000 sccm
    $C_2H_4$ gas=0.1 to 300 sccm
    $O_2$ gas=0.1 to 10 sccm
    $H_2$ gas=0 to 500 sccm
Pressure:
    1.33 to 667 Pa (0.01 to 5 Torr) when the surface of the wafer is an insulator or a semiconductor
    1.33 to 400 Pa (0.01 to 3 Torr) when the surface of the wafer is a metal (not having a catalytic function)
Temperature: 350 to 1,000 degrees C. (more preferably, 400 to 800 degrees C.)
Microwave power: 100 to 5,000 W in total (more preferably, 1,000 to 3,500 W)
Time: 1 to 200 min In the apparatus in this example as well, the carbon-containing gas in the first processing gas and the carbon-containing gas in the second processing gas may be the same gas and may be both, for example, the $C_2H_2$ gas. In that case, the $C_2H_4$ gas source 197 may be omitted.

EXPERIMENTAL EXAMPLE

Next, test examples will be described.

Experimental Example 1

In Experimental Example 1, bare Si substrates were prepared as substrates, and the effects of preprocessing performed prior to the film formation of a graphene structure through plasma CVD were confirmed. As the first processing gases, the $C_2H_2$ gas, the $H_2$ gas, and the Ar gas were used, and the flow rates were set to 1 sccm, 0.1 sccm, and 50 sccm, respectively. In addition, the pressure was set to 0.4 Torr, the substrate temperature was set to 700 degrees C., and the processing times were changed to 0 sec (without processing), 180 sec, and 600 sec.

Figure 10:
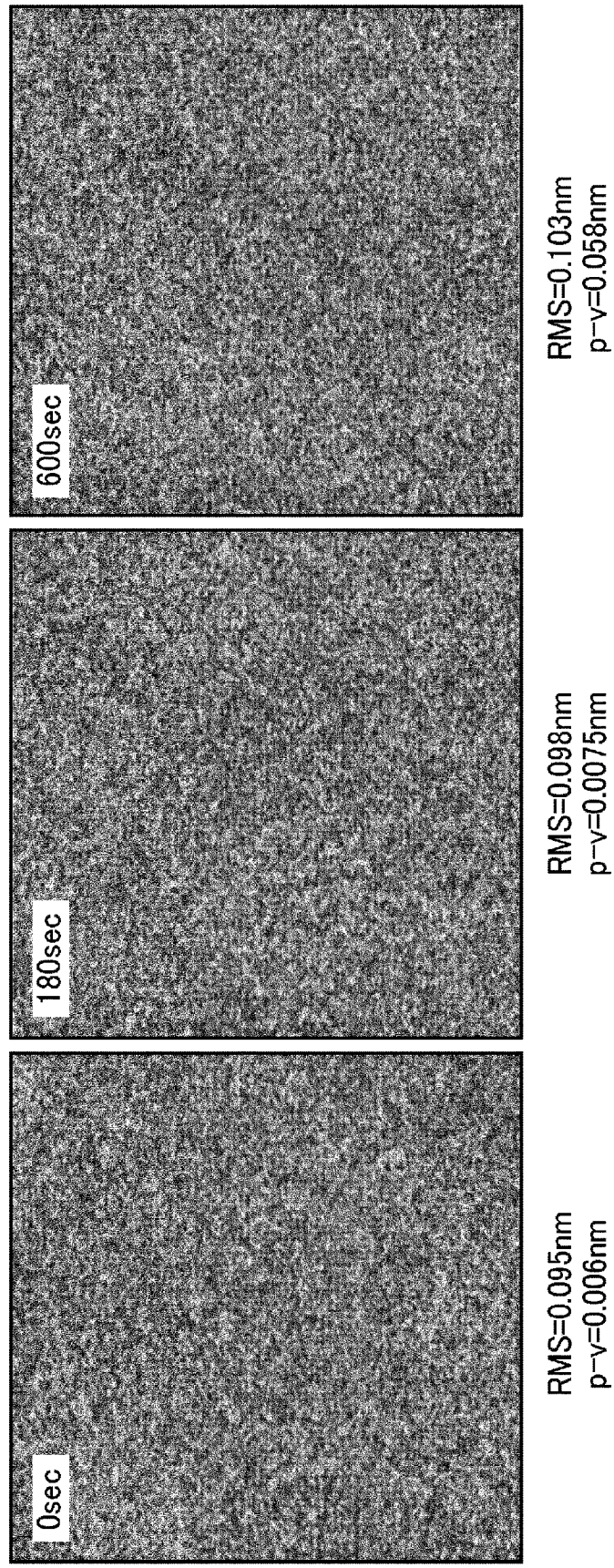
FIG. 10 illustrates AFM photographs showing respective surface states when preprocessing times were changed to 0 sec, 180 sec, and 600 sec in Experimental Example 1, respectively.
Figure 11:
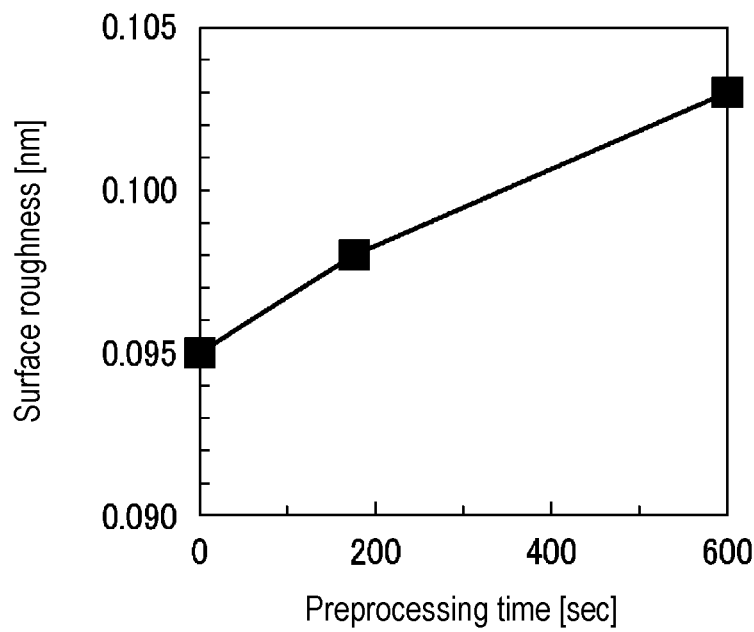
FIG. 11 is a diagram showing a relationship between the processing times in the preprocessing and the values of RMS in Experimental Example 1.
Figure 12:
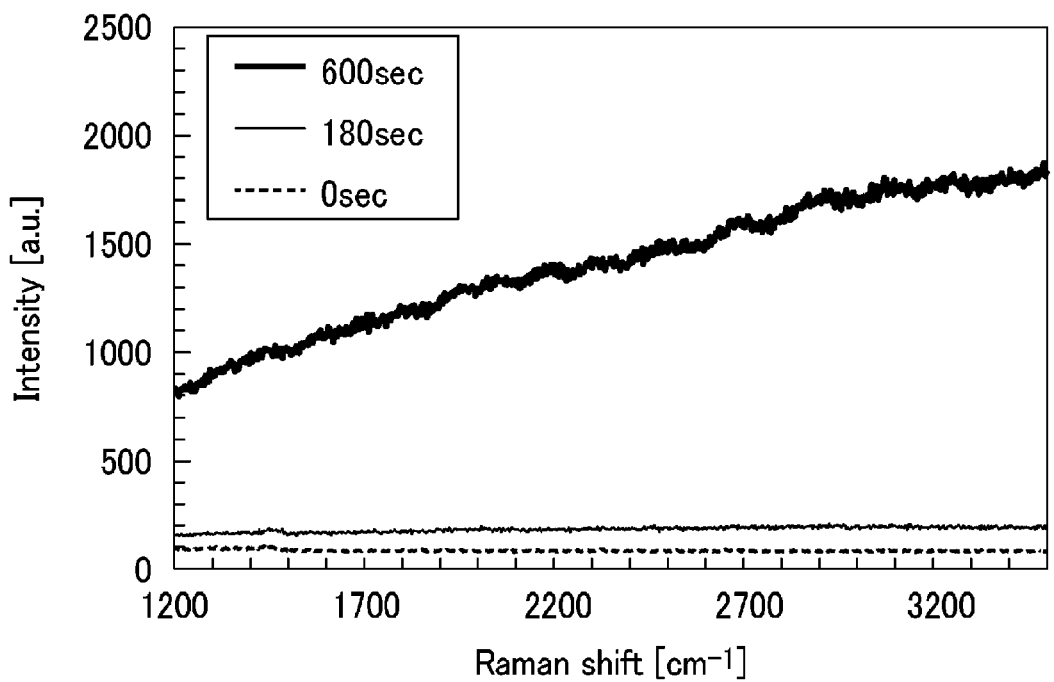
FIG. 12 is a diagram showing Raman spectra of a substrate surface when the processing times in the preprocessing were 0 sec, 180 sec, and 600 sec in Experimental Example 1.

FIG. 10 illustrates AFM photographs showing the surface states of the substrates. As illustrate in FIG. 10, when no processing was performed (0 sec), the surface roughness (RMS) value was 0.095 nm, whereas, when the processing times were 180 sec and 600 sec, the RMS values were increased to 0.098 nm and 0.103 nm, respectively. FIG. 11 shows a relationship between the processing times and the RMS values at this time. As shown in this figure, it can be seen that the RMS values increase as the processing times are longer. In addition, FIG. 12 shows Raman spectrums of the surfaces of the substrates when the processing times were 0 sec, 180 sec, and 600 sec. From FIG. 12, it can be seen that the background intensities of Raman spectrum increases as the processing times are longer.

These results suggest that there may be microcrystals or carbon that does not have a clear structure on the surfaces of the substrates due to the processing performed with the processing gas including the carbon-containing gas prior to the plasma CVD.

Experimental Example 2

In Experimental Example 2, graphene structures were formed through the plasma CVD after surface treatment and preprocessing were performed on the Si substrates as the substrates, using the processing apparatus of the first example illustrated in FIG. 5. The surface treatment and the plasma CVD were carried out under fixed conditions, and the time during the preprocessing was changed.

Figure 13:
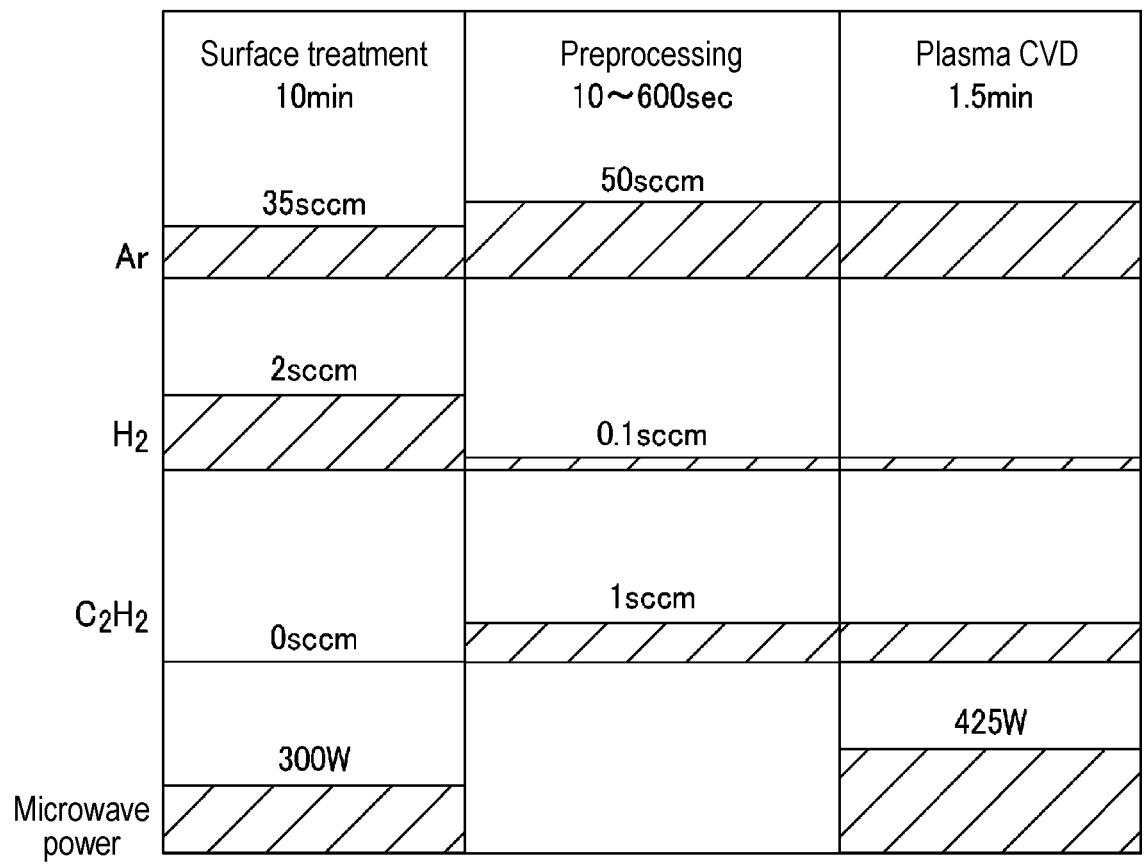
FIG. 13 is a diagram showing a process sequence of Experimental Example 2.

As the manufacturing conditions, the substrate temperature was set to 700 degrees C., and the pressure was set to 0.4 Torr. Other conditions were set as follows. The process sequences at this time are summarized in FIG. 13.

Figure 14:
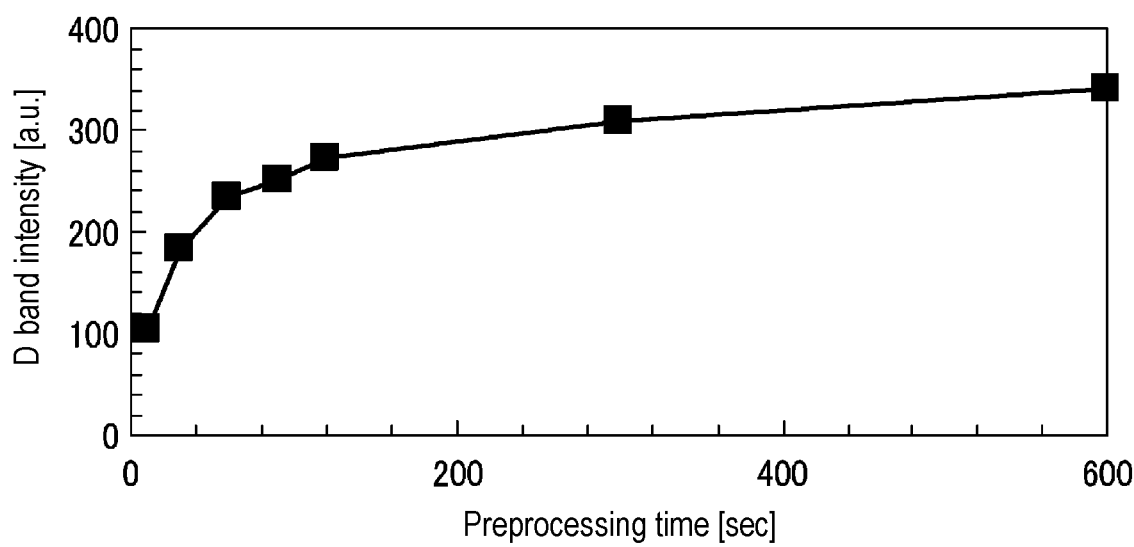
FIG. 14 is a diagram showing a relationship between the preprocessing times and the D band intensities (arbitrary unit) in Experimental Example 2.

Surface Treatment
  Ar gas: 35 sccm
  $H_2$ gas: 2 sccm
  Microwave power: 300 W
  Time: 10 min
Preprocessing
  Ar gas: 50 sccm
  $H_2$ gas: 0.1 sccm
  $C_2H_2$ gas: 1 sccm
  Time: 10 to 600 sec
Plasma CVD
  Ar gas: 50 sccm
  $H_2$ gas: 0.1 sccm
  $C_2H_2$ gas: 1 sccm
  Microwave power: 425 W
  Time: 1.5 min For the graphene structures formed under respective conditions, the amounts of formed films were determined based on the D band intensities of Raman spectrums (the D band intensities increased as the amounts of formed films increased). FIG. 14 is a diagram showing a relationship between the preprocessing times and the D band intensities (arbitrary unit). As shown in this figure, it was confirmed that the D-band intensities, that is, the amounts of formed films, increased as the preprocessing times were increased. FIG. 15 illustrates SEM photographs of surfaces when the preprocessing times were 10 sec, 60 sec, and 120 sec, respectively. It can be seen from the SEM photographs that the coverage increases as the preprocessing time increases. The above results suggest that the nucleation density of a graphene structure increases as the preprocessing time increases.

<Other Applications>

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, the plasma CVD is not limited to microwave plasma CVD. In addition, the processing apparatus for performing the remote microwave plasma CVD is not limited to the above-described examples, and various types of processing apparatuses may be used.

Furthermore, as the substrate for forming a graphene structure thereon, a semiconductor wafer based on a semiconductor, such as Si, has been described as an example, but the present disclosure is not limited thereto.

EXPLANATION OF REFERENCE NUMERALS

1, 101: processing container, 2, 102: stage, 3: microwave introduction mechanism, 4, 103: gas supply mechanism, 5: exhauster, 6, 106: controller, 82, 104 exhaust device, 100, 200: processing apparatus, 105: microwave introduction device, 300: substrate, 301: semiconductor substrate, 302: insulating film, 303: barrier film, 304: metal film, 310: nuclei, 320 graphene structure, W: wafer

What is claimed is:

1. A method of forming a graphene structure, the method comprising:
   providing a substrate;
   performing a preprocessing by supplying a first processing gas including a carbon-containing gas to the substrate while heating the substrate, without using plasma; and
   after the preprocessing, forming the graphene structure on a surface of the substrate through a plasma chemical vapor deposition (CVD) using plasma of a second processing gas including a carbon-containing gas,
   wherein the carbon-containing gas included in the first processing gas is a hydrocarbon gas.

2. The method of claim 1, wherein the preprocessing has a processing time of 30 seconds or more.

3. The method of claim 2, wherein the preprocessing has the processing time in a range of 1 to 10 minutes.

4. The method of claim 1, wherein the preprocessing is performed while heating the substrate at a temperature in a range of 300 to 1,000 degrees C.

5. The method of claim 1, wherein the hydrocarbon gas has an unsaturated bond.

6. The method of claim 1, wherein the first processing gas further includes a hydrogen gas.

7. The method of claim 1, wherein the carbon-containing gas included in the first processing gas and the carbon-containing gas contained in the second processing gas are a same gas.

8. The method of claim 1, wherein, in the forming the graphene structure, the graphene structure is formed in a state in which the surface of the substrate does not have a catalytic function.

9. The method of claim 8, wherein the surface of the substrate is an insulator, a semiconductor, or a non-activated metal.

10. The method of claim 1, wherein the plasma CVD is a remote microwave plasma CVD.

11. The method of claim 10, wherein the forming the graphene structure is performed under a condition in which a temperature of the substrate is in a range of 350 to 1,000 degrees C., a microwave power is in a range of 100 to 5,000 W, and a time is in a range of 1 to 200 minutes.

12. The method of claim 1, wherein the second processing gas further includes a hydrogen gas.

13. An apparatus for forming a graphene structure, comprising:
- a processing container in which a substrate is accommodated;
- a heating mechanism configured to heat the substrate;
- a planar slot antenna having a slot and provided on the processing container via a microwave transmission plate made of a dielectric material that constitutes a ceiling wall of the processing container;
- a microwave introduction mechanism configured to introduce microwaves into the processing container through the slot and the microwave transmission plate;
- a gas introduction mechanism configured to supply a processing gas including a carbon-containing gas and an oxidizing gas into the processing container;
- an exhaust mechanism configured to exhaust an interior of the processing container; and
- a controller configured to control the heating mechanism, the microwave introduction mechanism, the gas introduction mechanism, and the exhaust mechanism to execute:
- after the substrate is loaded into the processing container, performing a preprocessing by supplying a first processing gas including the carbon-containing gas to the substrate while heating the substrate, without using plasma; and
- after the preprocessing, forming the graphene structure on a surface of the substrate through a plasma CVD using plasma of a second processing gas including the carbon-containing gas,
- wherein the carbon-containing gas included in the first processing gas is a hydrocarbon gas.

\* \* \* \* \*